United States Patent [19]
Korsunsky et al.

[11] Patent Number: 5,199,885
[45] Date of Patent: Apr. 6, 1993

[54] ELECTRICAL CONNECTOR HAVING TERMINALS WHICH COOPERATE WITH AN EDGE OF A CIRCUIT BOARD

[75] Inventors: Iosif Korsunsky, Harrisburg; Dimitry G. Grabbe, Middletown, both of Pa.

[73] Assignee: AMP Incorporated, Harrisburg, Pa.

[21] Appl. No.: 873,526

[22] Filed: Apr. 21, 1992

Related U.S. Application Data

[63] Continuation of Ser. No. 692,084, Apr. 26, 1991, abandoned.

[51] Int. Cl.⁵ .............................. H01R 23/70
[52] U.S. Cl. ........................ 439/79; 439/83; 439/876
[58] Field of Search ................ 439/59–62, 439/79, 80, 78, 82, 83, 92, 101, 108, 876

[56] References Cited

U.S. PATENT DOCUMENTS

| | | | |
|---|---|---|---|
| 3,281,627 | 10/1966 | Fetterrolf | 439/79 |
| 4,616,893 | 10/1986 | Feldman | 439/83 |
| 4,621,880 | 11/1986 | Rush | 439/79 |
| 4,710,133 | 12/1987 | Lindeman | 439/62 |
| 4,762,500 | 8/1988 | Dola et al. | 439/79 |
| 4,836,806 | 6/1989 | Dougherty | 439/82 |
| 4,907,979 | 3/1990 | Feldman | 439/83 |
| 4,935,284 | 6/1990 | Puerner | 361/397 |
| 5,040,999 | 8/1991 | Collier | 439/62 |
| 5,127,839 | 7/1992 | Korsunsky et al. | 439/108 |

FOREIGN PATENT DOCUMENTS 2222917A  3/1990  United Kingdom.

Primary Examiner—Neil Abrams
Attorney, Agent, or Firm—Bruce J. Wolstoncroft

[57] ABSTRACT

An electrical connector has first terminals which are surface mounted to respective sides of a substrate and second terminals which extend through an edge surface of the substrate to make electrical connection to an opening provided in the substrate. As the connector is mated to the edge of the substrate, the connector occupies a minimal space on the substrate.

10 Claims, 16 Drawing Sheets

ELECTRICAL CONNECTOR HAVING TERMINALS WHICH COOPERATE WITH AN EDGE OF A CIRCUIT BOARD

This application is a continuation of application Ser. No. 07/692,084 filed Apr. 26, 1991 and now abandoned.

FIELD OF THE INVENTION

The invention is directed to an electrical connector which is mounted on a printed circuit board. In particular the invention relates to an electrical connector which has surface mount terminals and through-hole mounted terminals which extend from a mating surface thereof.

BACKGROUND OF THE INVENTION

There are currently numerous electrical connectors available which are mounted to a printed circuit board. As the size of the machines in which the printed circuit boards are installed decreases, the density of the connectors positioned on the board must increase. Also, as the machines become more sophisticated, the complexity of the printed circuit boards and the connectors must increase. Consequently, the configuration of the machines requires that electrical connectors with numerous terminals extending therefrom be mounted on a printed circuit board in such a manner so as to occupy a minimal area of board real estate.

In the early stages of the progression toward high density placement of the connectors, through-hole mounting technology was used. Mating portions of the terminals were placed in through-holes of the circuit board and held in place by soldering or some type of mechanical engagement of the pin with the sidewalls of the hole. As the need for high density increased, the amount of through-holes required also increased. However, as the diameter of the through holes is relatively large, only a fixed number of through-holes could be provided in a given area. Consequently, through-hole technology could not support the requirements for high density applications.

In order to provide for a higher density of connectors on the board, surface mount technology was utilized. As no through-holes were required, the conductive pads on the circuit board could be closely spaced, thereby allowing more contacts to be mounted in the same area of the board. Also, as the terminal were configured to be surface mounted to the printed circuit board, the terminals were designed to have resilient characteristics which allowed the terminals to compensate for board warpage and the like, thereby insuring for a more reliable interconnection.

It is also important to realize that as the density of the connectors increases, the length of the terminals cannot increase significantly. Particularly in high speed applications, the ideal solution is one which provides high density connectors which have the shortest path over which the signals must travel.

As the progression towards higher density continues, it has become imperative that every possible area of board real estate by utilized. Consequently, the invention described herein is directed to an electrical connector which can be mounted to the edge of a printed circuit board. This type of connector requires the use of both surface mount and through-hole mount technology. The invention also provides for increased performance of the electrical connector due to the relatively short lengths over which the signals must be carried.

SUMMARY OF THE INVENTION

The invention is directed to a method of providing an electrical connection between an electrical connector and an edge surface of a substrate. In order to accomplish this, pins of the electrical connector are inserted into the edge surface of the substrate, thereby positioning the pins of the electrical connector in an opening of the substrate.

The invention is also directed to a connector, for electrically engaging the openings of a printed circuit board through the edge surface of the printed circuit board, and to a connector assembly. The connector assembly has a housing with first and second terminals extending therefrom. The first and second terminals have respectively first and second mounting portions which cooperate with a printed circuit board provided proximate the housing. The printed circuit board has conductive areas provided on surfaces thereof and conductive openings which extend between the surfaces.

The first terminals are secured in the housing, with first securing portions of the first terminals provided in first terminal receiving cavities. The first mounting portions are integral with the first securing portions and extend outside the housing, thereby allowing the first mounting portions to cooperate with the conductive areas provided on the printed circuit board. The second terminals are also secured in the housing, with second securing portions of the second terminals provided in second terminal receiving cavities. The second mounting portions are integral with the second securing portions and extend outside the housing, thereby allowing the second mounting portions to cooperate with the conductive openings provided on the printed circuit board.

The conductive openings of the printed circuit board are positioned proximate an edge surface of the printed circuit board. The second mounting portions have lead-in surfaces provided at free ends thereof. The lead-in surfaces cooperate with the edge surface of the substrate to allow the second mounting portions to be inserted through the edge surface into the openings of the substrate.

A further aspect of the invention has apertures provided in the edge surfaces of the printed circuit board. The apertures extend in a direction which is essentially perpendicular to the axis of the conductive openings, and are dimensioned to receive the second mounting portions of the second terminals therein, such that the second terminals extend through the apertures into the conductive openings.

DETAILED DESCRIPTION OF THE INVENTION

Figure 1:
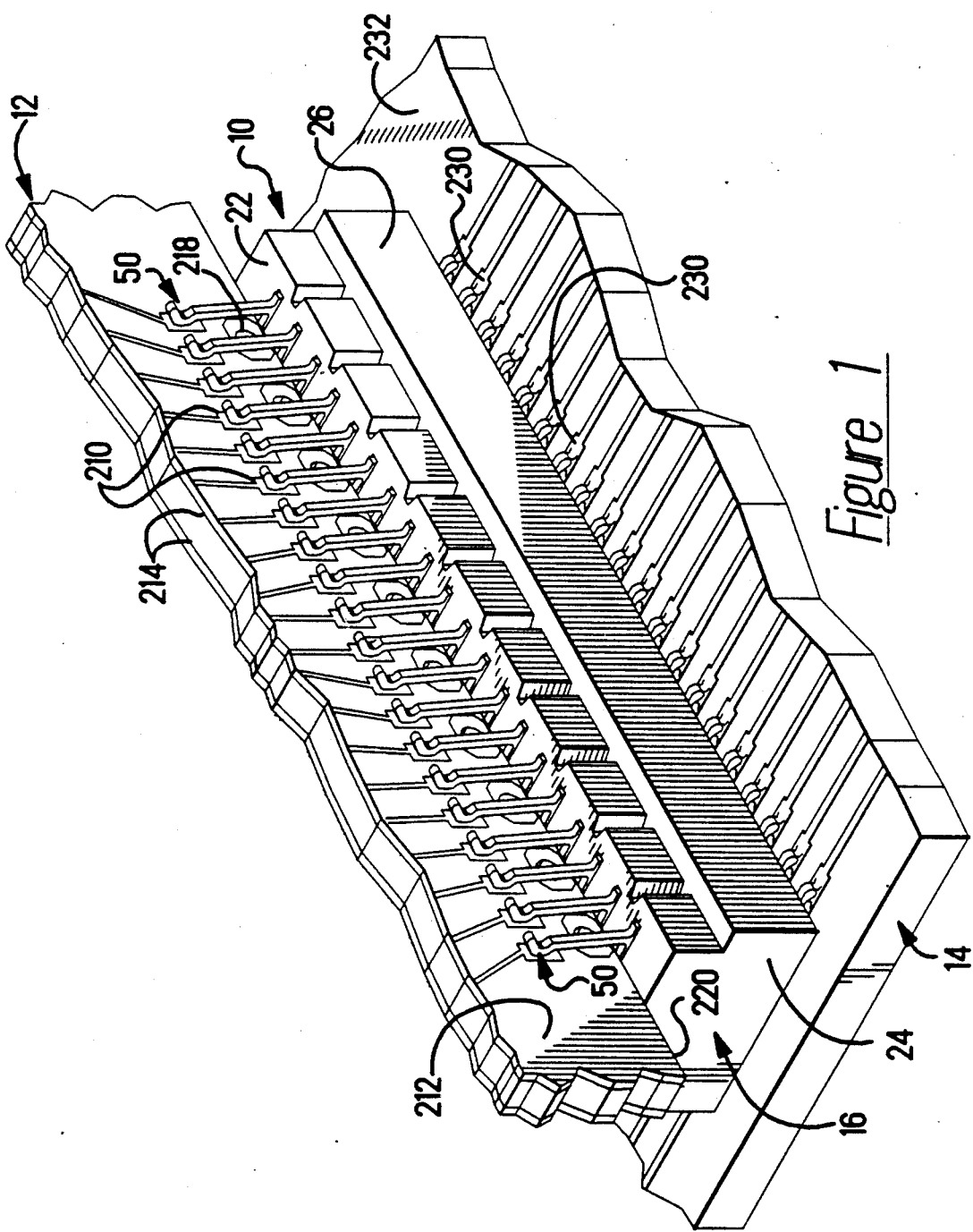
FIG. 1 is a perspective view of a connector assembly which provides an electrical connection between sides of a first printed circuit board and a surface of a second printed circuit board.
Figure 2:
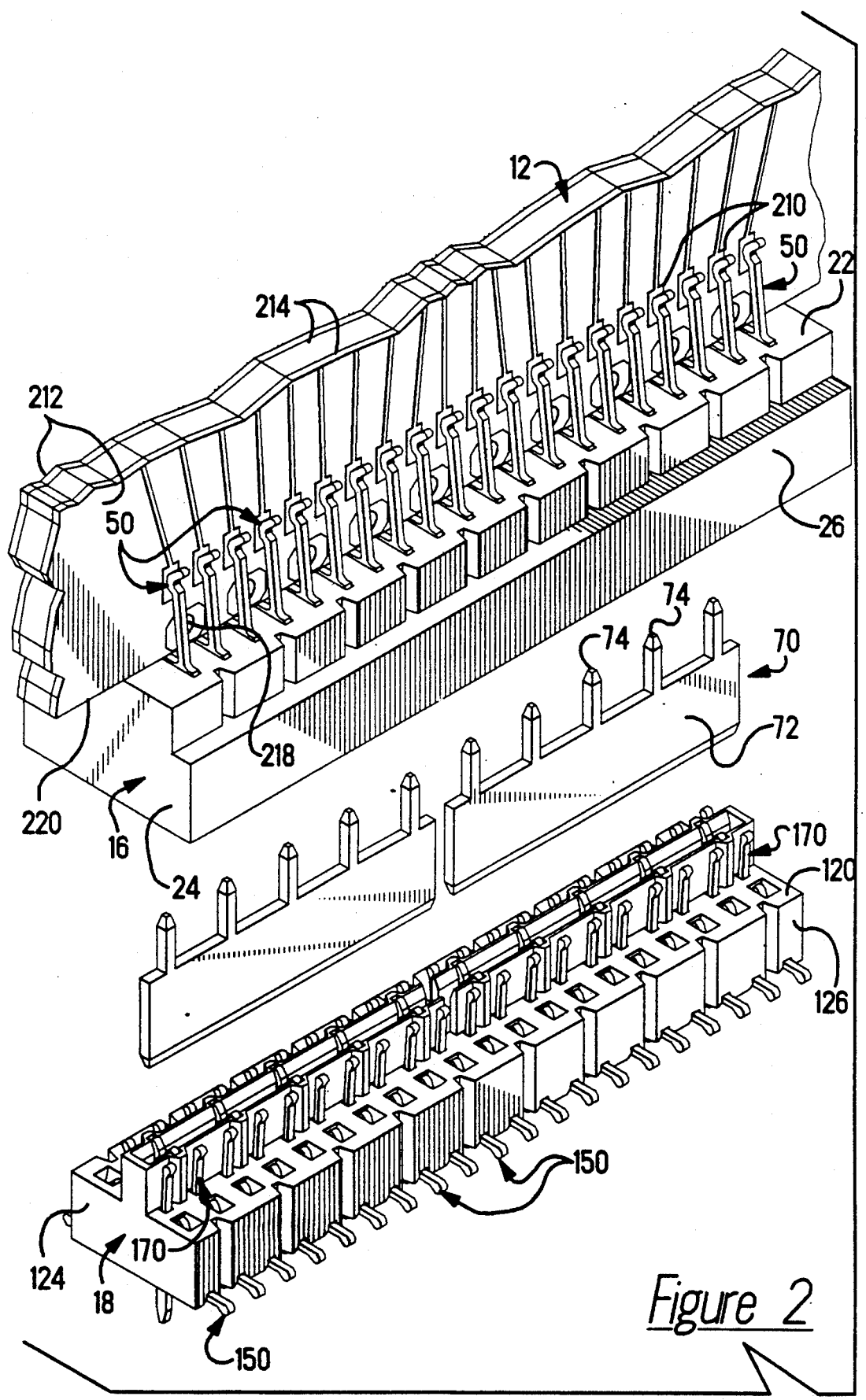
FIG. 2 is an exploded perspective view of the connector assembly of FIG. 1, showing a first connector housing and a second connector housing, with a bus bar provided therebetween.

Referring to FIG. 1, an electrical connector assembly 10 is shown which is used to provide the electrical connection between a first circuit board 12 and a second circuit board 14. The connector assembly 10 has a first connector housing 16 and a second connector housing 18, as best shown in FIG. 2.

Figure 3:
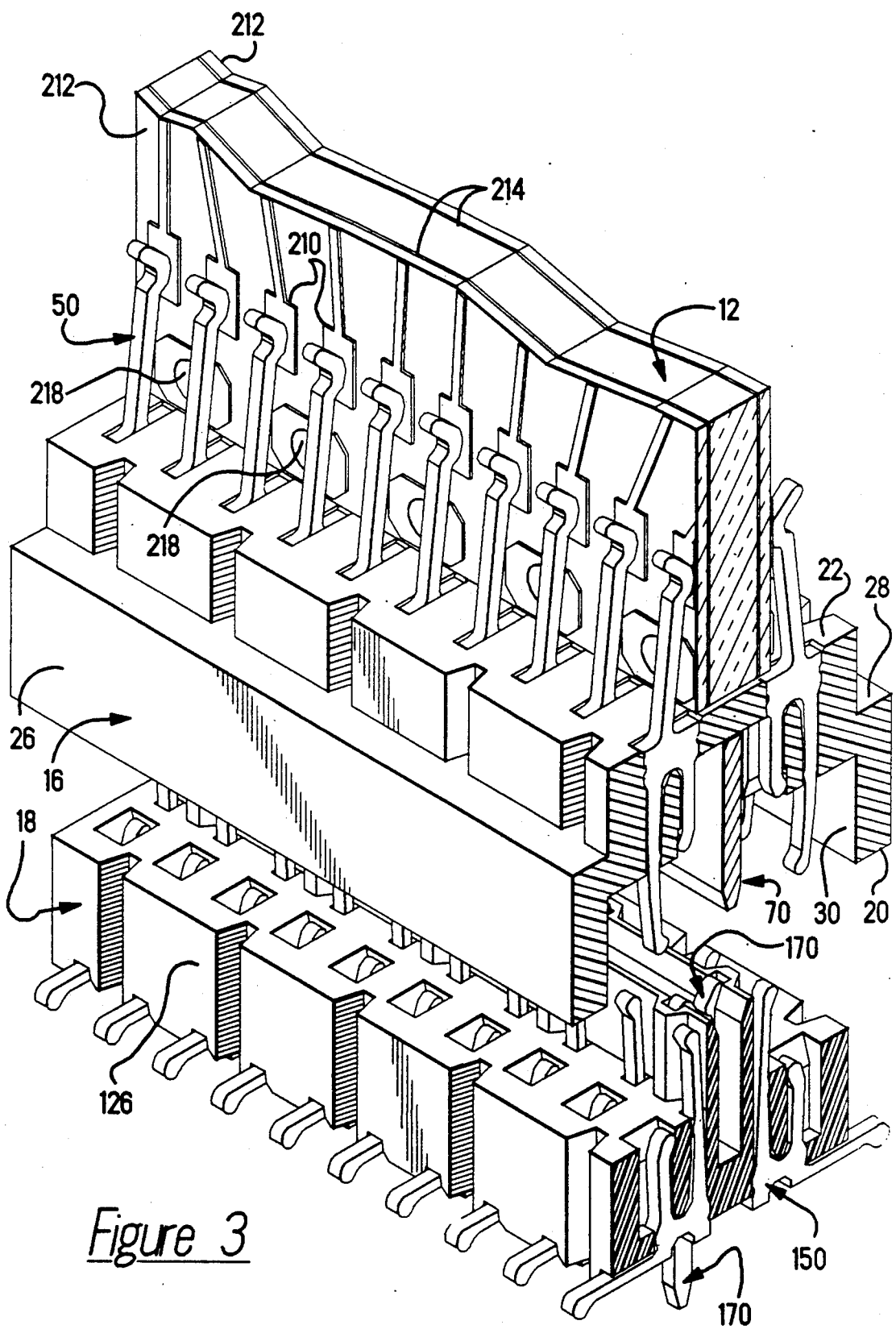
FIG. 3 is a partial cross-sectional view of the connector housings shown in FIG. 2, the bus bar of FIG. 2 is positioned in the first connector housing.
Figure 4:
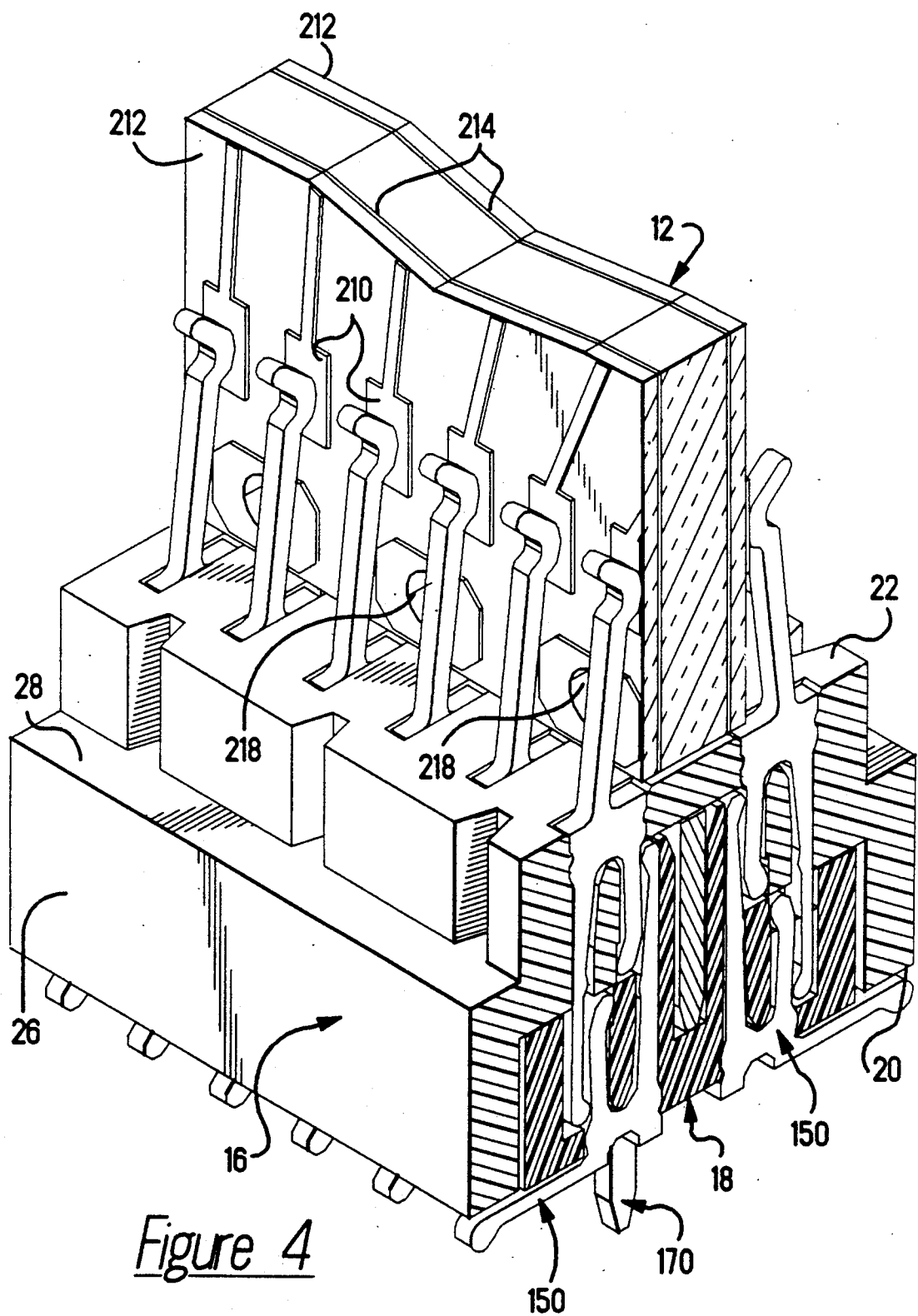
FIG. 4 is a partial cross-sectional view of the connector housings, similar to that shown in FIG. 3, with the connector housings mated together
Figure 5:
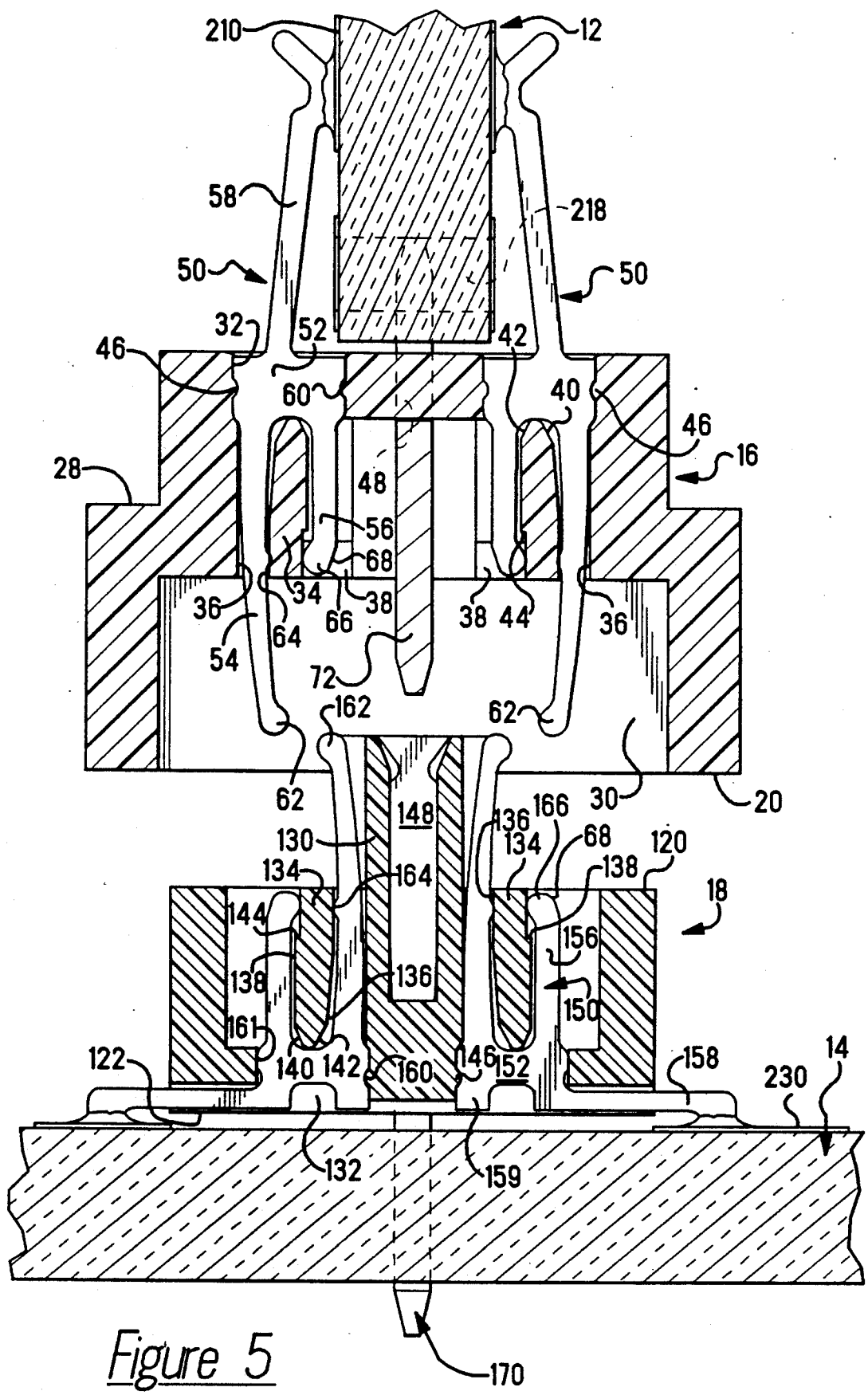
FIG. 5 is a cross-sectional view of the connector housings prior to connector housings being mated with each other.

The first connector housing 16 is best shown in FIGS. 2 through 9. Referring to FIGS. 3 and 5, the first connector housing 16 has a first or mating surface 20 and an oppositely facing second or terminal receiving surface 22. End walls 24 (FIGS. 8 and 9) and side walls 26 extend between the mating surface 20 and the terminal receiving surface 22. The side walls 26 have transition portions 28 provided thereon, as the mating surface 20 is larger than the terminal receiving surface 22.

Figure 9:
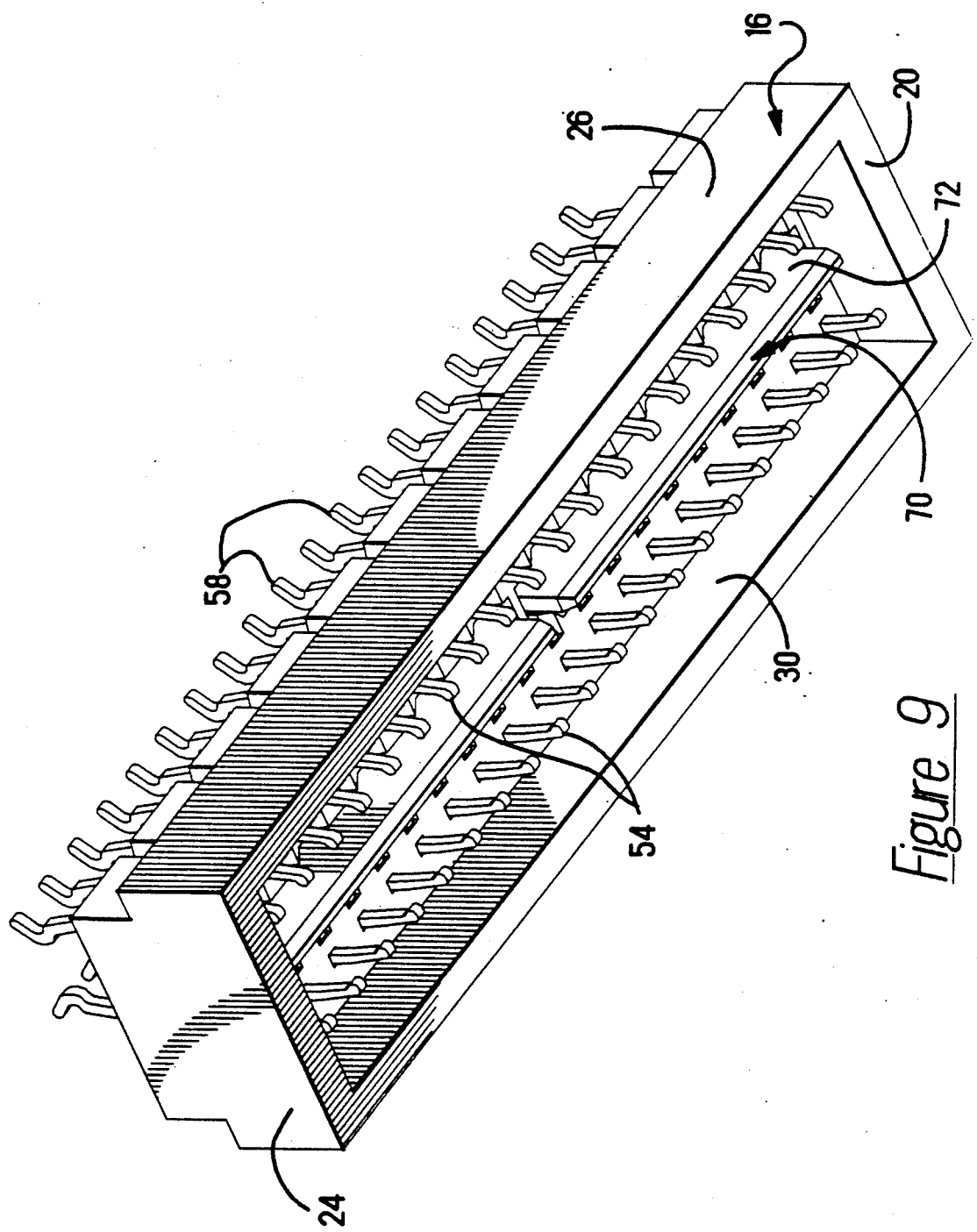
FIG. 9 is a bottom perspective view of the first connector housing, before the first connector housing has been positioned on the edge of the first printed circuit board.

A mating connector receiving recess 30 extends from the mating surface 20 toward the terminal receiving surface 22. The mating connector receiving recess 30, as best shown in FIG. 9, is dimensioned to be positioned proximate the end walls 24 and proximate the side walls 26.

Terminal receiving cavities 32 are provided in the first connector housing 16 and extend from the terminal receiving surface 22 to the mating connector receiving recess 30. As best shown in FIG. 5, the terminal receiving cavities 32 are provided on both sides of the longitudinal axis of the first connector housing 16. The terminal receiving cavities 32 provided on a respective side of the axis are mirror images of the terminal receiving cavities provided on the opposite side of the axis. Referring to FIG. 5, the terminal receiving cavities 32 have dividing walls 34 which separate the terminal receiving cavities into two portions, first leg receiving cavities 36 and second leg receiving cavities 38. The dividing walls 34 have lead-in surfaces 40, 42 which are provided proximate the terminal receiving surface 22. Shoulders 44 are provided on the dividing walls 34 on surfaces of the dividing walls which are positioned proximate the second leg receiving cavities 38. Securing projections 46 are also provided in the terminal receiving cavities 32.

Figure 7:
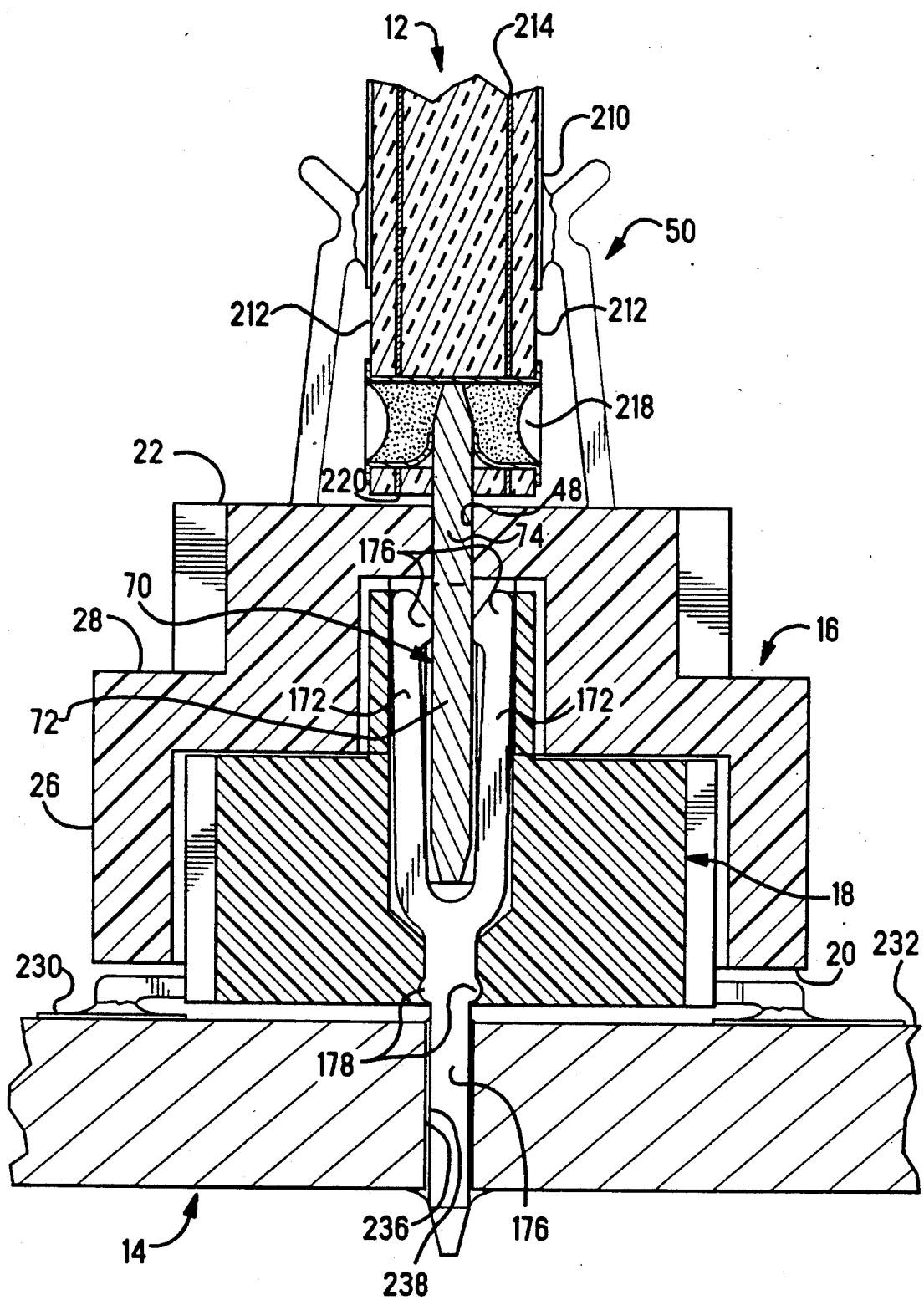
FIG. 7 is a cross-sectional view of the connector housings, taken in a different plane than the cross-sectional view of FIG. 6, showing the connector housings in a mated condition.
Figure 8:
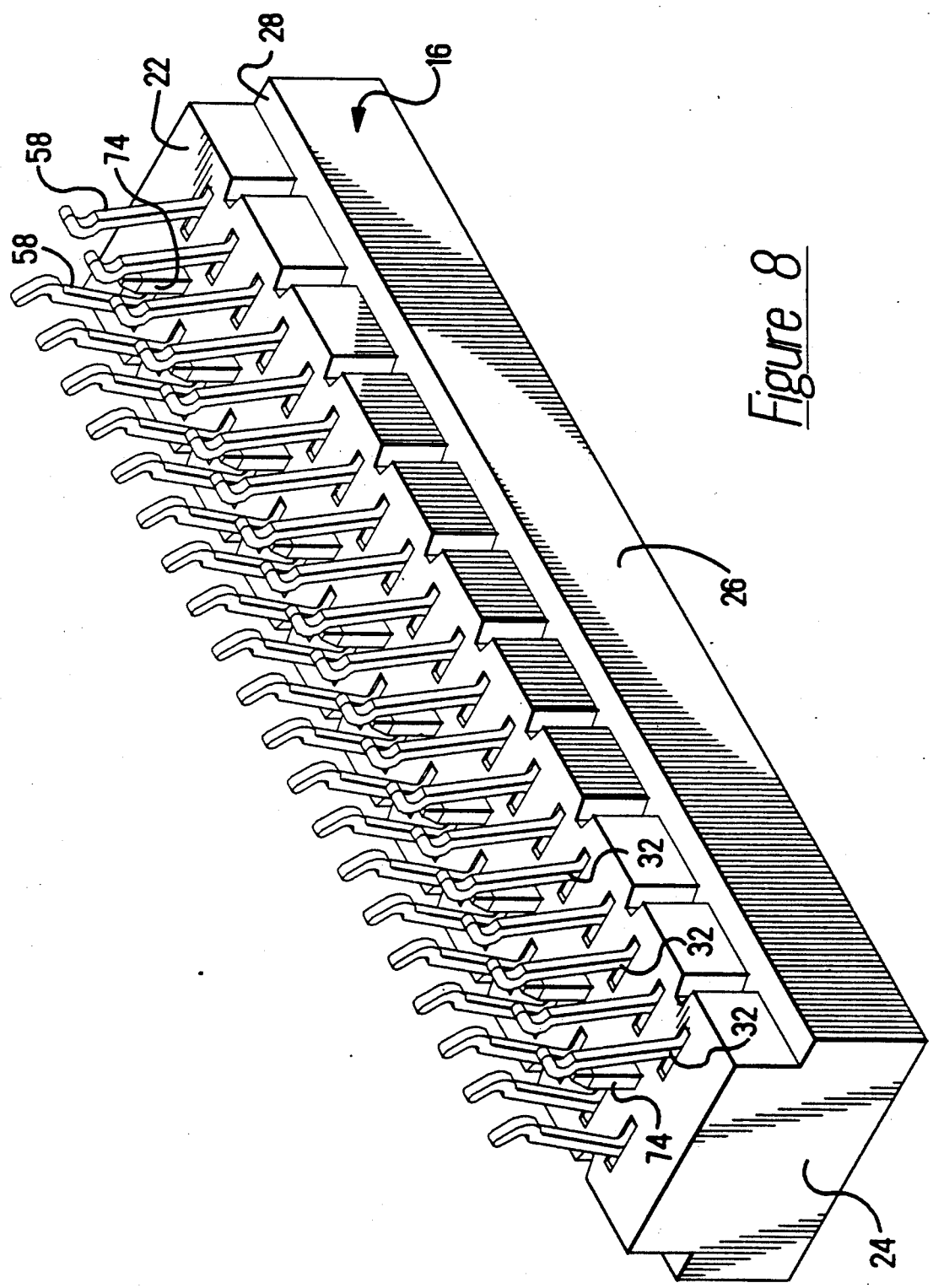
FIG. 8 is a top perspective view of the first connector housing, before the first connector housing has been positioned on the edge of the first printed circuit board.

Bus bar receiving recesses 48, as best shown in FIGS. 5 and 7, are provided in the first connector housing 16. The bus bar receiving recesses 48 extend from the mating connector receiving recess 30 to the terminal receiving surface 22.

First connector terminals 50, as best shown in FIG. 5, have mounting portions 52. First legs 54 and second legs 56 extend from the mounting portions 52 is essentially the same direction, thereby enabling the first and the second legs 54, 56 to be mated with the mating connector, as will be more fully discussed. Printed circuit board mating legs 58 extend from the mounting portions 52 in a direction which is opposed to the first and second legs 54, 56.

The mounting portions 52 have recesses 60 provided on side surfaces thereof. The recesses 60 cooperate with the securing projections 46 to provide the interference fit required to maintain the terminals 50 in the terminal receiving cavities 32. It should be noted that end surfaces of the dividing walls 34 also cooperate with surfaces of the mounting portions 52 to ensure that the terminals 50 are properly positioned.

First legs 54 have a slightly arcuate configuration. Free ends of the first legs have enlarged contact sections 62 which extend beyond the first leg receiving cavities 36 and into the mating connector receiving recess 30. Enlarged positioning sections 64 are also provided on the first legs 54. The positioning sections 64 cooperate with the dividing walls 34 when the first legs are in an unmated condition. It is important to note that the first leg receiving cavities 36 are dimensioned to allow the first legs 54 to move therein, thereby allowing the first legs to move from an unmated or slightly prestressed position to a mated position.

Second legs 56 are positioned in the second leg receiving cavities 38. Unlike the first legs, the second legs 56 do not extend into the mating connector receiving recess 30. Free ends 66 of the second legs are provided at an angle relative to the second legs. This allows the free ends 66 to engage the dividing walls 34, as shown in FIG. 5. Lead-in surfaces 68 are provided at the free ends 66 of the second legs 56.

Referring to FIGS. 2 and 7, bus bars 70 are positioned in the first connector housing 16 (as best shown in FIGS. 7 and 9). The bus bars 70 have connector mating portions 72 and circuit board mating pins 74. The circuit board mating pins 74, as shown in FIG. 7, are positioned in the bus bar receiving recesses 48. The connector mating portions extend from the bus bar receiving recesses 48 into the mating connector receiving recess 30.

The second connector housing 18 is best shown in FIGS. 2 through 7 and 10 through 11. Referring to FIGS. 3 and 5, the second connector housing 18 has a first or mating surface 120 and an oppositely facing second or terminal receiving surface 122. End walls 124 (FIGS. 10 and 11) and side walls 126 extend between the mating surface 120 and the terminal receiving surface 122.

Figure 10:
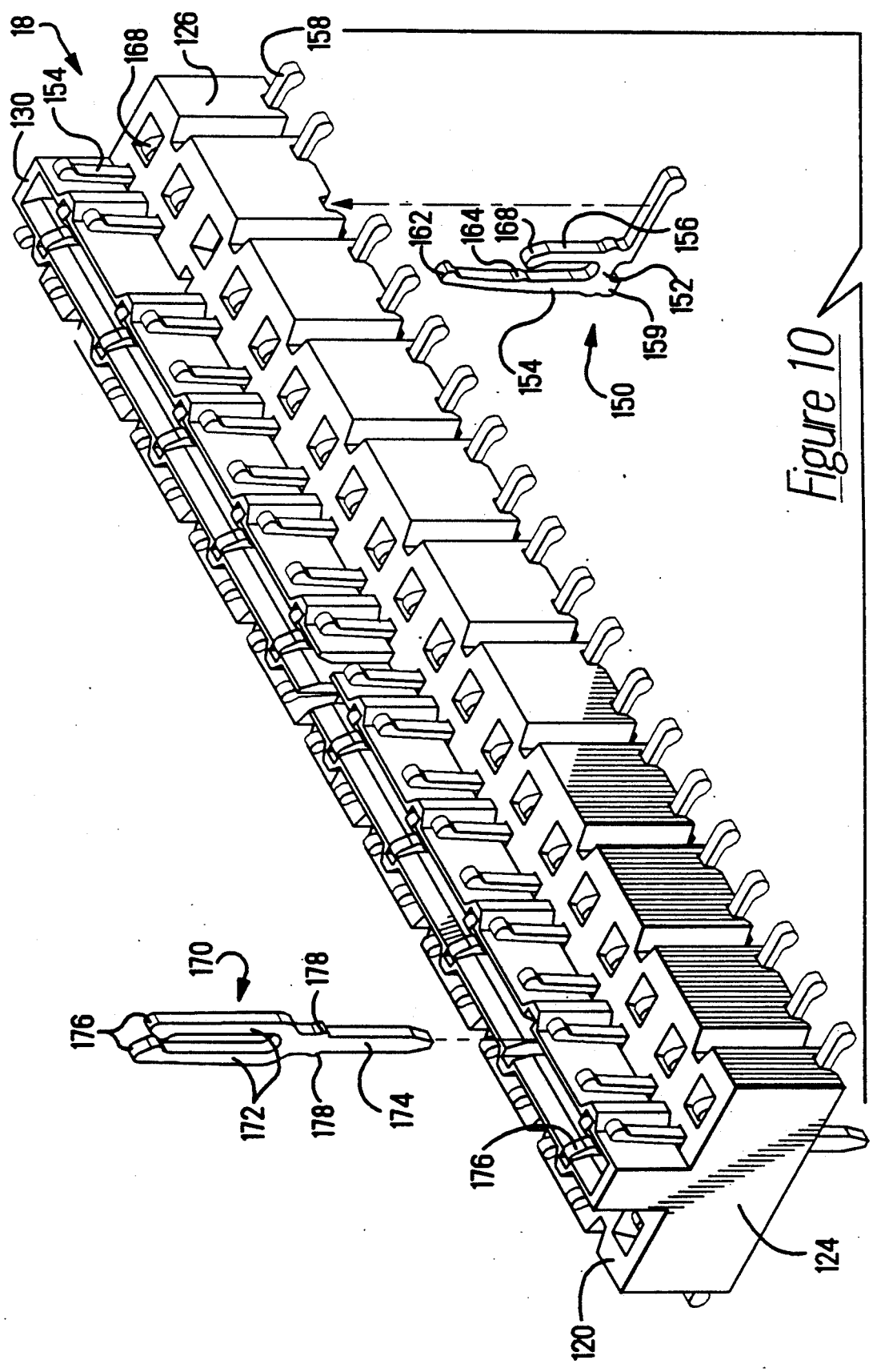
FIG. 10 is a top perspective view of the second connector housing with several terminals exploded therefrom, before the second connector housing has been positioned on the surface of the second printed circuit board.
Figure 11:
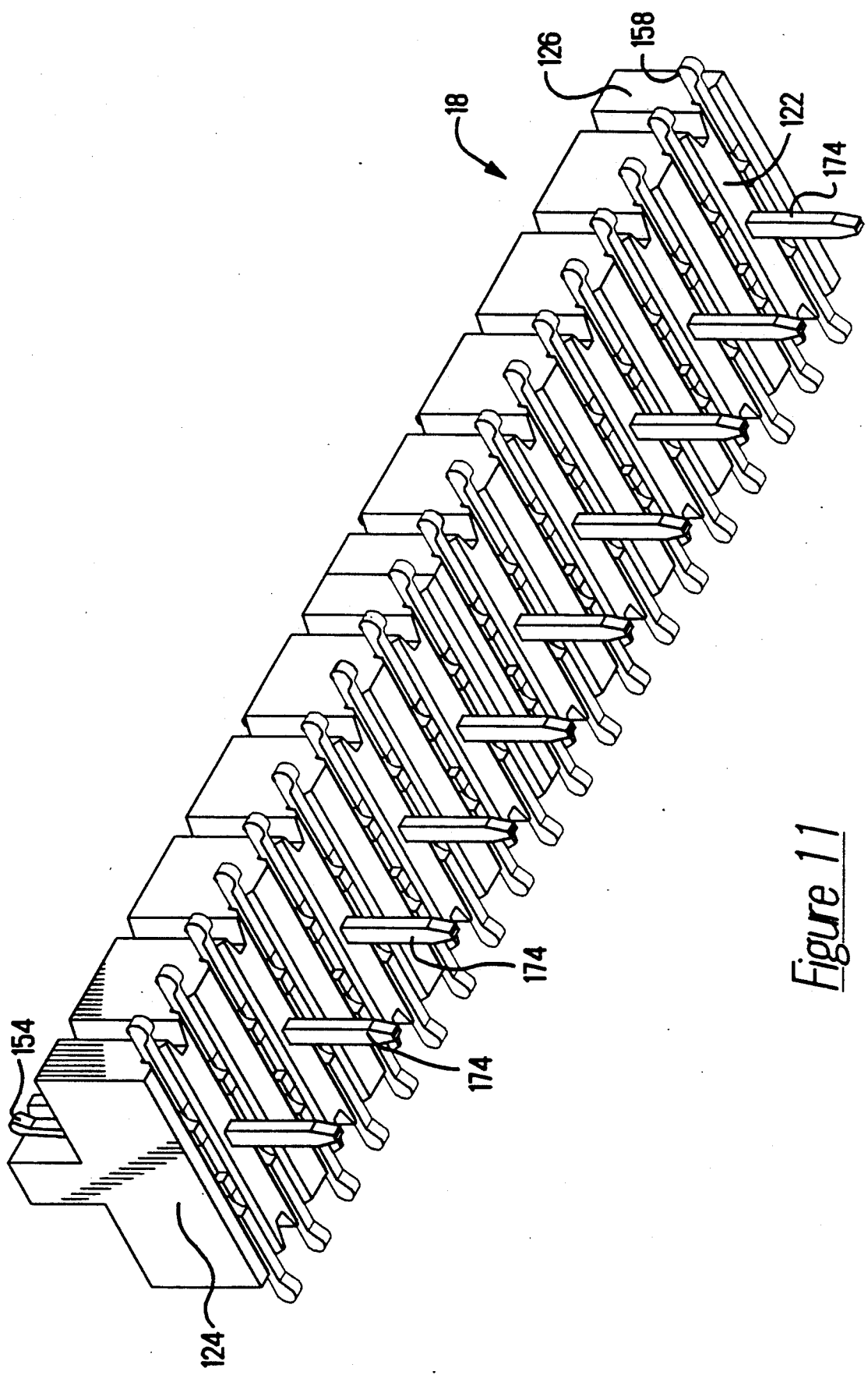
FIG. 11 is a bottom perspective view of the second connector housing, before the second connector housing has been positioned on the surface of the second printed circuit board.

A mating projection 130 extends from the mating surface 120 away from the terminal receiving surface 122. The mating projection 130, as best shown in FIG. 10, is dimensioned to extend between the end walls 124.

Terminal receiving cavities 132 are provided in the second connector housing 18 and extend from the terminal receiving surface 122 to the mating surface 120. As best shown in FIG. 5, the terminal receiving cavities 132 are provided on both sides of the longitudinal axis of the second connector housing 18. The terminal receiving cavities 132 provided on a respective side of the axis are mirror images of the terminal receiving cavities provided on the opposite side of the axis. Referring to FIG. 5, the terminal receiving cavities 132 have dividing walls 134 which separate the terminal receiving cavities into two portions, first leg receiving cavities 136 and second leg receiving cavities 138. The dividing walls 134 have lead-in surfaces 140, 142 which are provided proximate the terminal receiving surface 122. Shoulders 144 are provided on the dividing walls 134 on surfaces of the dividing walls which are positioned proximate the second leg receiving cavities 138. Securing projections 146 are also provided in the terminal receiving cavities 132.

Bus bar receiving recess 148, as best shown in FIGS. 5 and 7, is provided in the second connector housing 18. The bus bar receiving recess 148 extends from the terminal receiving surface 122 past the mating surface 120 through the mating projection 130.

Second connector terminals 150, as best shown in FIG. 5, have mounting portions 152. First legs 154 and second legs 156 extend from the mounting portions 152 is essentially the same direction, thereby enabling the first and the second legs 154, 156 to be mated with the mating connector, as will be more fully discussed. Printed circuit board mating legs 158 and stand off legs 159 extend from the mounting portions 152 in a direction which is opposed to the first and second legs 154, 156.

The mounting portions 152 have recesses 160 provided on side surfaces thereof. The recesses 160 cooperate with the securing projections 146 to provide the interference fit required to maintain the terminals 150 in the terminal receiving cavities 132. Terminals 150 have projections 161 which extend from side surfaces thereof. The projections 161 facilitate the interference fit of the terminals. It should be noted that end surfaces of the dividing walls 134 also cooperate with surfaces of the mounting portions 152 to ensure that the terminals 150 are properly positioned.

First legs 154 have a slightly arcuate configuration. Free ends of the first legs have enlarged contact sections 162 which extend beyond the first leg receiving cavities 136 and beyond the mating surface 120. Enlarged positioning sections 164 are also provided on the first legs 154. The positioning sections 164 cooperate with the dividing walls 134 when the first legs are in an unmated condition. It is important to note that the first leg receiving cavities 136 are dimensioned to allow the first legs 154 to move therein, thereby allowing the first legs to move from an unmated or slightly prestressed position to a mated position.

Second legs 156 are positioned in the second leg receiving cavities 138. Unlike the first legs, the second legs 156 do not extend beyond the mating surface 120. Free ends 166 of the second legs are provided at an angle relative to the second legs. This allows the free ends 166 to engage the dividing walls 134, as shown in FIG. 5. Lead-in surfaces 168 are provided at the free ends 166 of the second legs 156.

Referring to FIGS. 7 and 10, bus bar mating terminals 170 are positioned in the second connector housing 18. The bus bar mating terminals 170 have connector mating portions 172 and circuit board mating pins 174. The connector mating portions 172 have an essentially U-shaped configuration, with enlarged contact projections 176 provided at the free ends thereof. The circuit board mating pins 174 have enlarged securing projections 178 which cooperate with the side walls of the receiving recess 148 to maintain the bus bar mating terminals 170 in the recess.

The first printed circuit board 12, as best shown in FIGS. 1 through 4, has conductive signal paths 210 provided on the opposing side surfaces 212 thereof. Conductive grounding planes 214 are positioned below the side surfaces 212, as shown in FIG. 3. The conductive grounding planes 214 are provided in electrical engagement with conductive side walls 216 of openings 218. The particular configuration of the first printed circuit board 12 has the openings 218 provided proximate edge surface 220 of the circuit board.

The second printed circuit board 14, as shown in FIGS. 1 and 7, has conductive signal paths 230 provided on at least one surface 232 thereof. Conductive grounding planes (not shown) are positioned below the surface 232. The conductive grounding planes are provided in electrical engagement with conductive side walls 236 (FIG. 7) of openings 238.

In operation, the first connector housing 16 is positioned in electrical engagement with the first printed circuit board 12. In order to accomplish this electrical connection, the fully assembled first connector housing 16, with the bus bars 70 provided therein, is positioned in some type of mounting fixture (not shown). The mounting fixture can be a standard type mounting fixture which is dimensioned to receive the first connector housing 16 therein. It is important that the mounting fixture be dimensioned to support the bus bars 70 is the housing, as the bus bars 70 are only positioned in the housing with an interference fit. The first connector housing 16 is positioned in the fixture such that the printed circuit board mating legs 58 and the circuit board mating pins 74 extend outward therefrom, in a manner similar to that shown in FIG. 8.

With the first connector housing 16 properly positioned in the fixture, the first connector housing is moved into engagement with the first circuit board 12. In particular, the first connector housing is moved into engagement with the edge surface 220 of the board 12.

As the first connector housing 16 and the first circuit board 12 are moved into engagement, the printed circuit board mating legs 58 will engage the edge surface 220 of the first circuit board 12. It should be noted that the distance provided between the free ends of opposed mating legs 58 is less than the width of the first circuit board 12. Consequently, when the printed circuit board mating legs 58 first engage the board 12, the legs 58 will contact the edge surface 220. Upon further insertion of the first connector housing 16 onto the first circuit board 12, the legs 58 will be force to spread apart and slide over the opposing side surfaces 212 of the board. This motion continues until the housing 16 is fully inserted onto the board 12, thereby positioning the legs 58 is electrical engagement with the conductive signal paths 210 provided on the board. The electrical engagement between the legs 58 and the paths 210 is ensured due to the legs are provided in a stressed position, and consequently provide a significant normal force between the legs and the paths.

Figure 17:
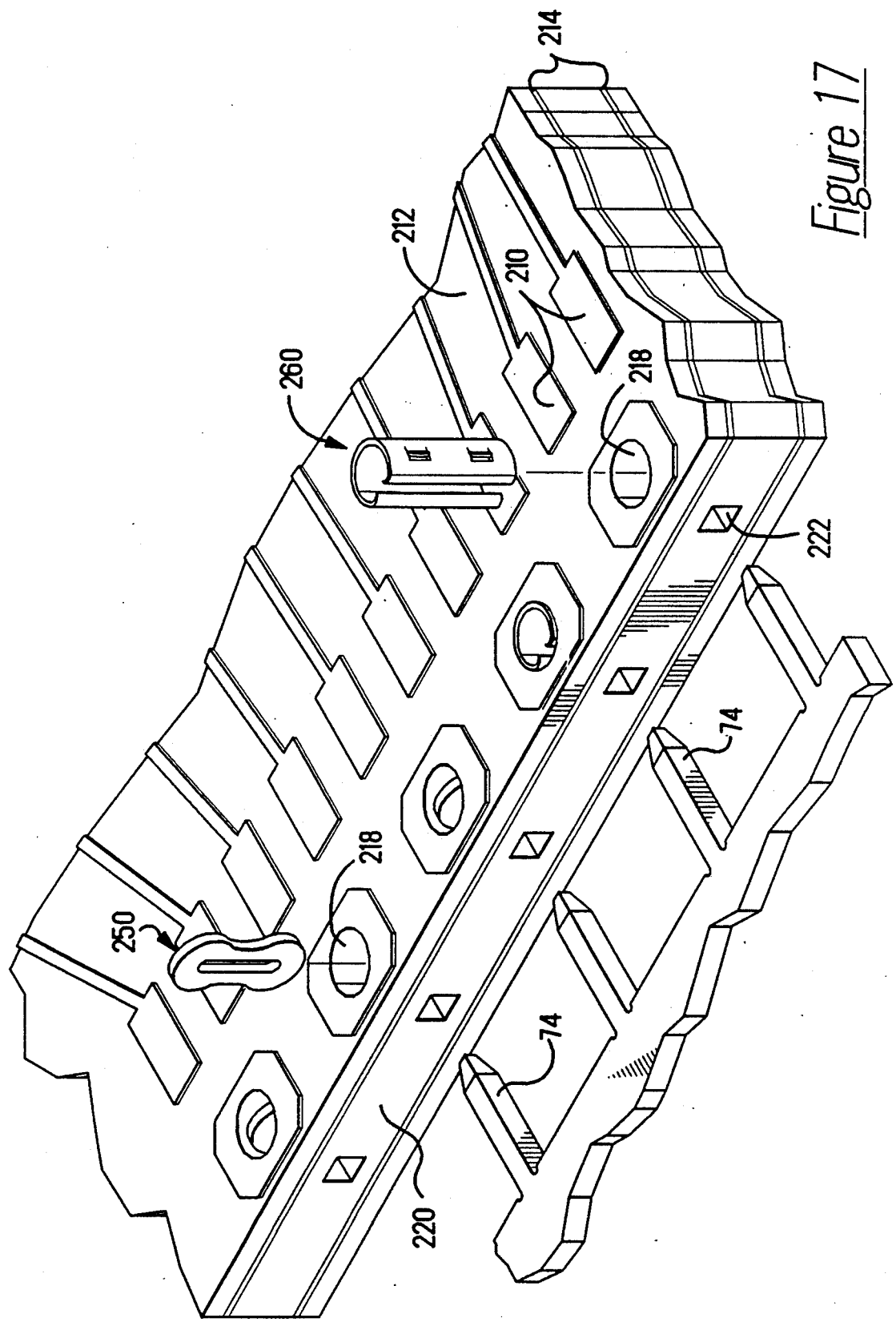
FIG. 17 is a perspective view of the first printed circuit board illustrating the positioning of the retention member and the alternative retention member in the openings of the first printed circuit board.

As the mating of the housing 16 with the board 12 occurs, the circuit board mating pins 74 also cooperate with the first circuit board 12. The pins 74 engage the edge surface 220 of the board after the printed circuit board mating legs 58 have begun sliding over the opposing side surfaces 212. It is important to note that the pins 74 must be provided in alignment with the openings 218 of the board 12 (as shown in FIG. 17) as the mating occurs. In order to insert the pins 74 through the edge surface 220, the pins must exert a force on the side surface to allow the pins to penetrate the material of the circuit board. This force is generated by the fixture in which the first connector housing 16 is positioned. As the fixture maintains the bus bars 70 and the pins 74 in position relative to the housing, the insertion of the pins in the side surface of the board does not damage the bus bar or the housing.

As shown in FIG. 17, the edge surface 220 of the first circuit board 12 can be prenotched to provided apertures 222 through which the pins 74 can be inserted. The prenotching reduces the insertion force required to position the pins 74 through the edge surface 220 of the board.

As the insertion of the pins through the edge surface 220 continues, the pins 74 enter into openings 218 through side walls 216 thereof. Referring to FIG. 7, the insertion of the pins 74 is continued until the free ends of the pins 74 extend essentially across the openings 218. The openings illustrated in FIG. 7 have plating provided on the side walls 216 thereof. As the pins are inserted through the side walls, the pins 74 cause the plating to be deformed, as is shown in FIG. 7. This deformation provides a good electrical connection between the pins and the plating, and also enhances the mechanical retention of the pins in the openings.

With the first connector housing 16 fully inserted on the first circuit board 12, the printed circuit board mating legs 58 are soldered to the conductive signal paths 210, and the circuit board mating pins 74 are soldered in the openings 218. This provides the mechanical and electrical connections required between the first connector housing 16 and the first circuit board 12.

Figure 18:
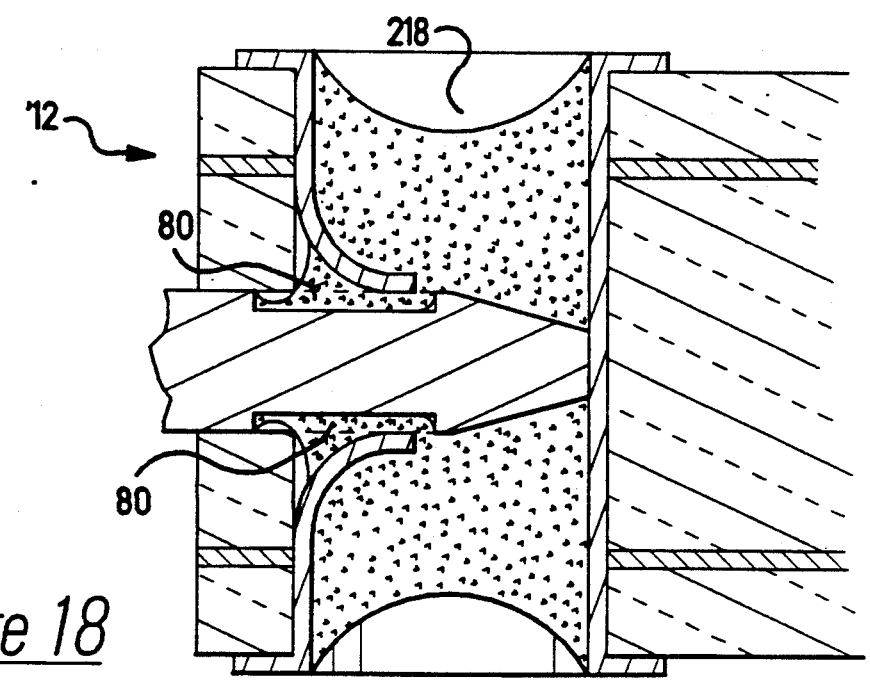
FIG. 18 is an enlarged cross-sectional view of showing an alternate embodiment of a terminal inserted into the opening of the printed circuit board

An alternative embodiment of the printed circuit board mating legs is shown in FIG. 18. In this embodiment, the printed circuit board mating legs have grooves or pockets 80 provided thereon. As the mating legs are inserted, the legs cause the plating of the openings 218 to tear, as was previously described. However, in this embodiment, the grooves provide a channel between the end of the plating and the mating legs. As is shown in the figure, the grooves can extend to the end of the mating legs, or the grooves can be of shorter length. Consequently, when the mating pins are soldered in the openings, the solder will flow into the grooves and beyond the free ends of the plating, as shown in FIG. 18, providing for a more reliable mechanical connection between the first circuit board and the first connector housing. It should be noted that the dimensioning of the grooves will vary depending upon the thickness and the ductility of the plating used in the opening. The grooves must be properly dimensioned to allow the plating to tear rather than conform to the opening.

Figure 12:
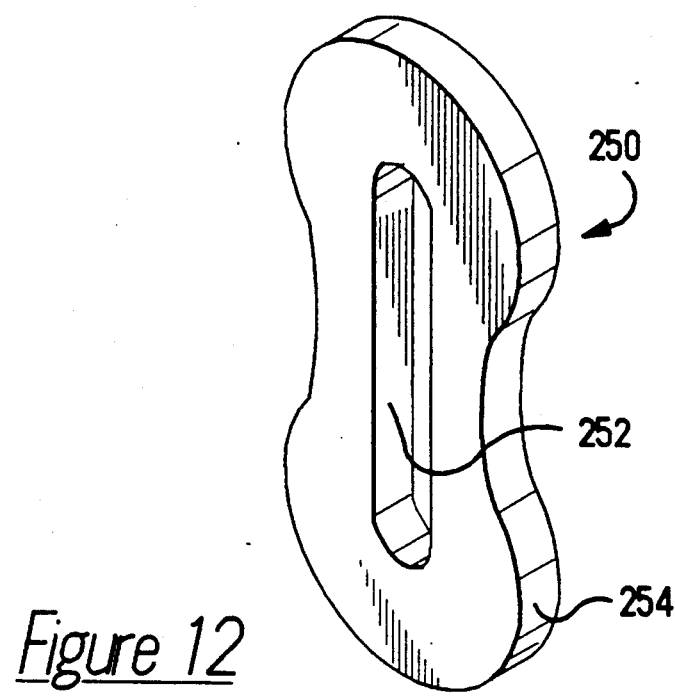
FIG. 12 is a perspective view of a retention member which can be inserted into an opening of the first printed circuit board.
Figure 13:
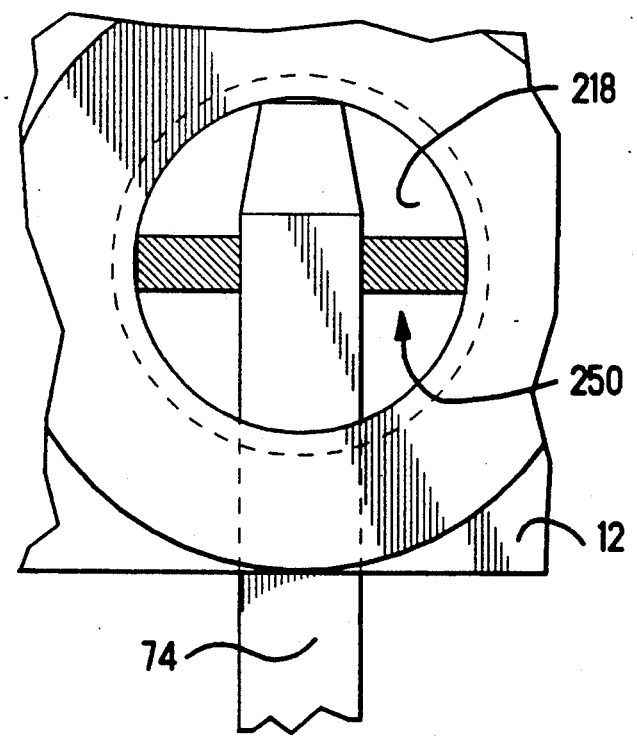
FIG. 13 is an enlarged cross-sectional view of a respective opening of the first printed circuit board with the retention member and a terminal of the first connector housing position therein.
Figure 14:
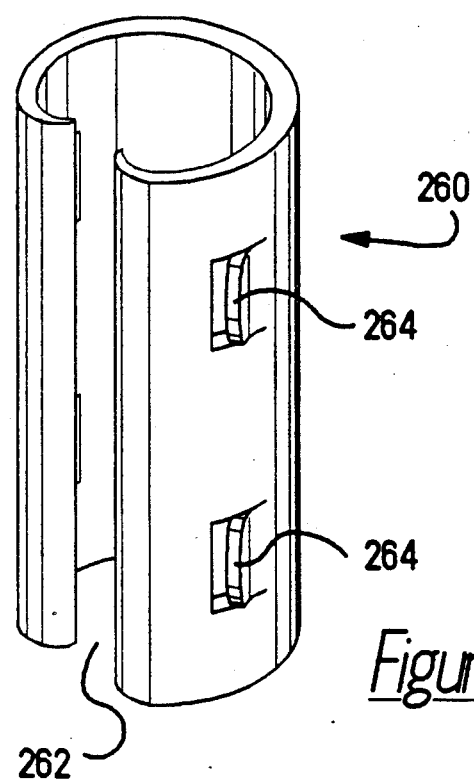
FIG. 14 is a perspective view of an alternative retention member which can be inserted into an opening of the first printed circuit board.
Figure 15:
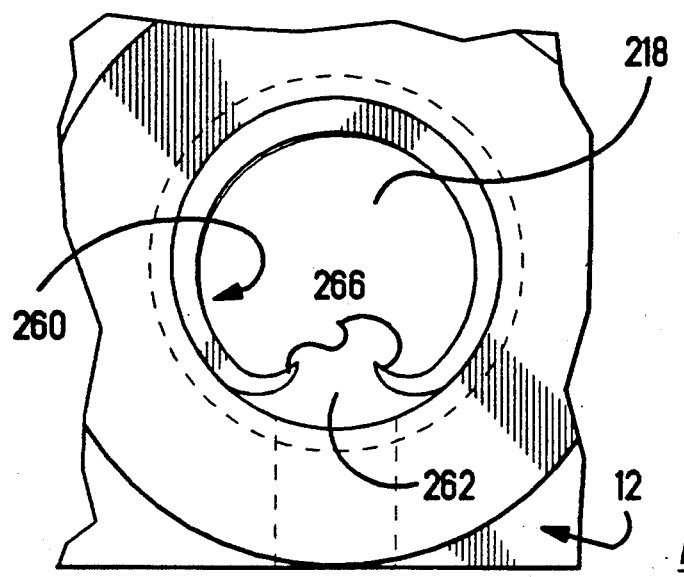
FIG. 15 is an top plan view of a respective opening of the first printed circuit board with the alternative retention member inserted therein.

Referring to FIGS. 13 through 17, several alternate methods of maintaining the pins 74 in the openings 218 are shown. FIG. 12 shows a first retention member 250 which can be used to retain the pins in the openings. The retention member 250 is inserted into the opening 218, as illustrated in FIG. 17, prior to the mating of the first connector housing with the first circuit board. The insertion of the housing on the board is identical to that described above. However, when the pins are inserted into the openings, the pins will be inserted through openings 252 provided in the retention members, as shown in FIG. 13. The retention members are dimensioned to ensure that a frictional engagement occurs between the side walls 216 of the openings 218 and the side surfaces 254 of the retention members. The openings 252 are dimensioned to ensure that a frictional engagement is provided between the pins 74 and the retention members 250. Consequently, the use of the retention members 250 in the openings 218 provides the mechanical and electrical connection required without the use of solder in the openings 218.

Figure 16:
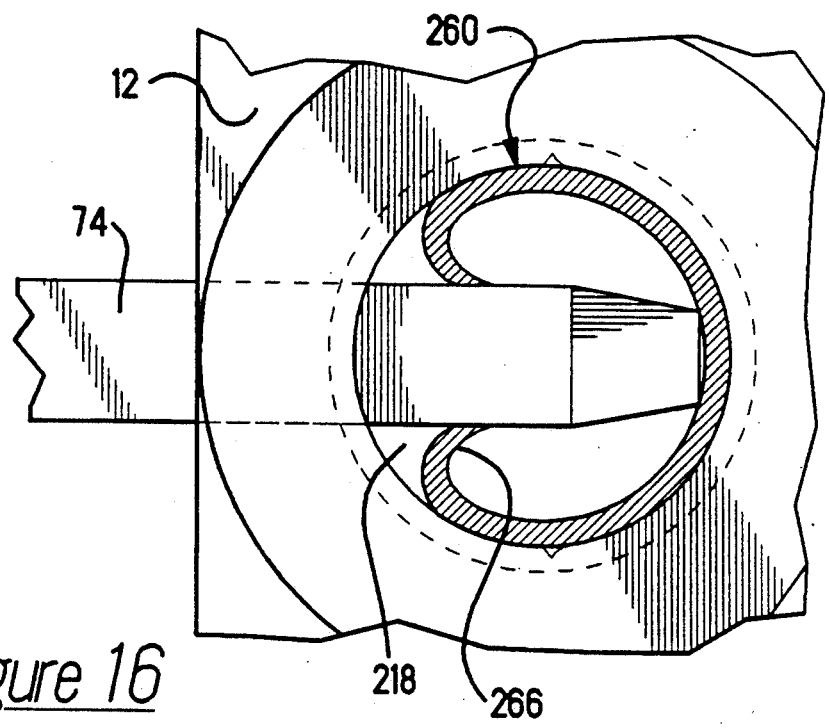
FIG. 16 is a cross-sectional view of the respective opening of the first printed circuit board with the alternative retention member and a terminal of the first connector housing position therein.

A second retention member 260 is shown in FIGS. 14 through 17. The second retention member 260 is cylindrical in shape. A slot 262 is provided along the length of the retention member 260. The retention member 260 is positioned in the opening 218, as shown in FIG. 17. With the member 260 positioned in the opening, retention lances 264 (FIG. 14) project into the side walls of the openings to provide the retention and electrical characteristics required between the member 260 and the side walls 216 of the openings 218. The pins 74 are then inserted into the openings 218, as shown in FIG. 16, through the slots 262 of the retention members 260. Retention arms 266 behave as "Chinese fingers" to retain the pins in the openings. The retention arms also provide the electrical connection required between the members 260 and the pins 74, thereby eliminating the need for solder in the openings.

The are several advantages of utilizing a connector which is mounted onto the side surface of a circuit board. First, as the sophistication of equipment increases, more connectors are required to be positioned on circuit boards. As there is a limited amount of space available, solutions must be found to increase the amount of connectors mated to the circuit board. This invention allows the edges or side surfaces of the circuit board to be utilized for the mating of connectors thereto. Also, the placement of the connectors on the side surfaces of the circuit board allows for relatively short path lengths across which the signals travel, thereby minimizing the propagation delay associated with the connector.

With the insertion of the first connector housing 16 onto the first circuit board 12 complete, the fixture can be removed from the housing.

The second connector housing 18 is positioned on the second circuit board 14, as is illustrate in FIGS. 1 and 5 through 7. During this process, the circuit board mating pins 174 are inserted into the openings 238 provided on the circuit board 14. As the pins 174 are inserted into the openings 238, the printed circuit board mating legs 158 engage the conductive signal paths 230 provided on the surface 232 of the circuit board 230. The engagement of the legs 158 with the paths 230 defines the fully inserted position of the second connector housing relative to the second circuit board. With the second connector housing fully inserted, the pins 174 are soldered in the openings 238 and the legs 158 are soldered to the conductive paths 230. This provides the mechanical and electrical connection required between the second connector housing 18 and the second circuit board 14. The circuit board mating legs 58, 158 have arcuate surfaces provided at the ends thereof. The solder cooperates with the arcuate surface to provide the mechanical and electrical interconnection with the circuit boards. The configuration of the arcuate surfaces helps to insure that the solder will not crack. In other words, the use of mating legs which have flat surfaces promotes the solder to crack, thereby causing an unreliable connection.

With the first and second connector housings 16, 18 properly mounted to the circuit boards 12, 14, the connector housings are mated together, as shown in FIGS. 4 through 7.

The first connector housing 16 is positioned proximate the second connector housing 18 such that the mating connector receiving recess 30 of the first housing is in alignment with the second connector housing. The mating connector receiving recess 30 is dimensioned to allow the second connector housing 18 to be inserted therein.

Figure 6:
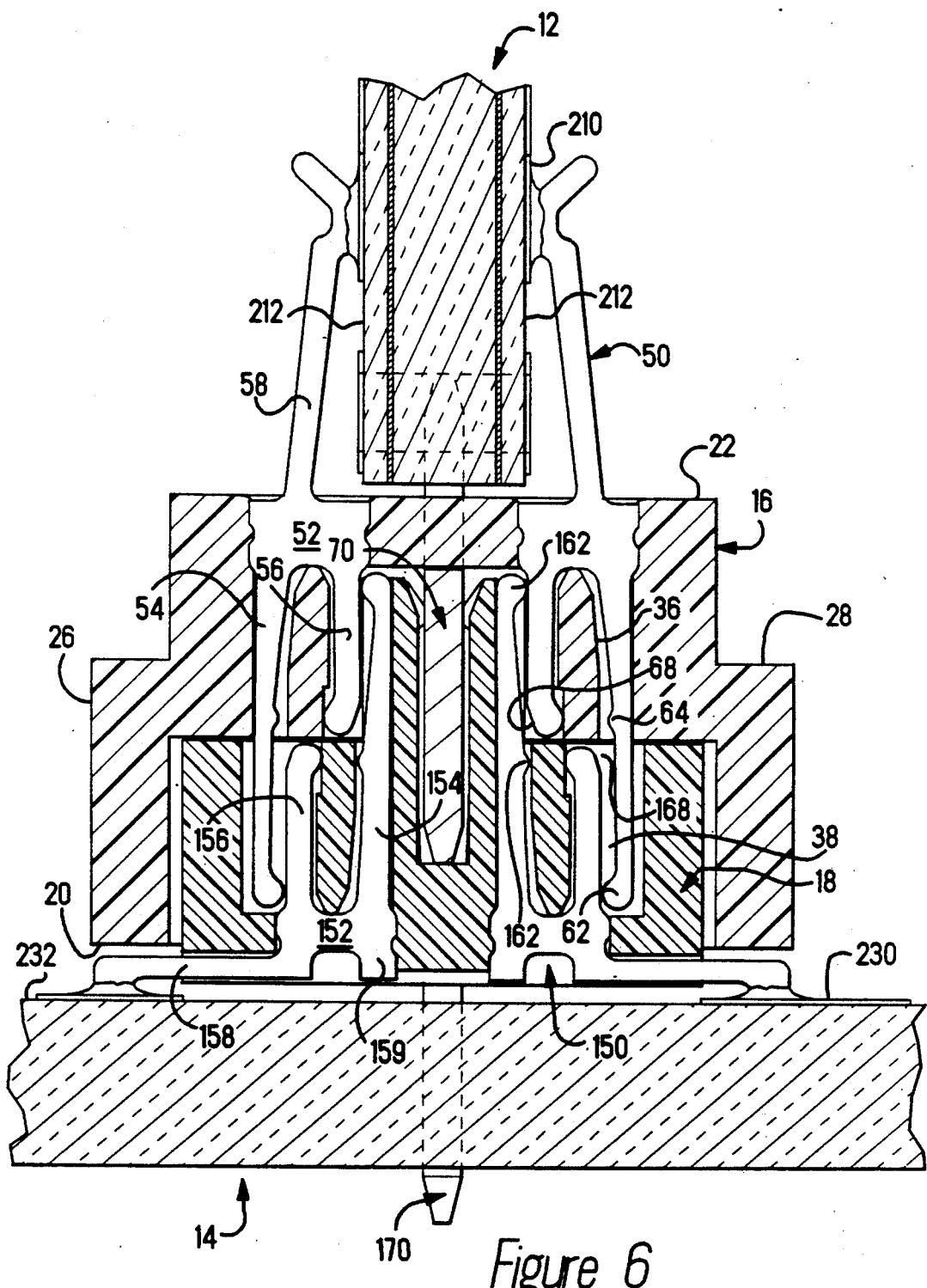
FIG. 6 is a cross-sectional view of the connector housings, similar to that of FIG. 5, showing the connector housings in a mated condition.

To mate the connector housings together, the first connector housing 16 is moved from the initial position shown in FIG. 5 to the final or assembled position shown in FIG. 6. As the connector housings are moved to the assemble position, the first connector terminals 50 engage the second connector terminals 150 to provide the electrical connection required.

As the mating occurs, the enlarged contact sections 62 of the first legs 54 of the first connector terminals 50 engage the lead-in surfaces 168 of the second legs 156 of the second connector terminals 150. At the same time, the enlarged contact sections 162 of the first legs 154 of the second connector terminals 150 engage the lead-in surfaces 68 of the second legs 56 of the first connector terminals 50.

The enlarged contact sections 62, 162 are then slide over the lead-in surfaces 168, 68, thereby positioning the enlarged contact sections 62, 162 on side surfaces of the second legs 156, 56. Several functions are performed by the lead-in surfaces. The lead-in surfaces compensate for any slight misalignment of the terminals when the mating occurs. The lead-in surfaces also cause the first legs 54, 154 to be moved to a stressed position, such that the enlarged contact sections 62, 162 will provide a significant normal force on the second legs 156, 56 when the contact sections are slide over the second legs.

As the mating of the connectors continues, the enlarged contact sections 62, 162 will be slid on the side surfaces of the second legs 156, 56 to the fully assembled position shown in FIG. 6. This sliding engagement of the enlarged contact sections provides a wiping action under significant normal force conditions, thereby helping to ensure for a positive electrical connection between the enlarged contact sections 62, 162 and the second legs 156, 56. It should be noted that as the enlarged contact sections 62, 162 of the first legs 54, 154 are slid over second legs 156, 56, walls of the housings prevent the first legs 54, 154 from taking a permanent set. In other words, the walls of the housings are provided in close proximity to the first legs 54, 154, thereby insuring that the first legs can not be deformed beyond their elastic limit.

This type of terminal configuration allows for a connector which requires a minimal height for operation. As the entire length of the first legs 54, 154 are used for a resilient beam, the overall height of the connector can be minimized. In other words, the stationary portions of the terminals are provided on the second legs of the terminals, which is physically distinct from the first legs. Consequently, as no stationary portions are required on the first legs, the overall height of the first legs is minimized. It is also important to note that the second legs 56, 156 are used only as stationary members, i.e. no resilient characteristics are required. Consequently, the second legs can be secured in the housings and be used to stabilize the terminals in the housings.

The configuration of the terminals also provides for a reliable electrical connection. Each terminal provides two parallel paths over which the signal can travel. This provides for a redundant electrical connection, and results in a self inductance which is approximately half of that of a terminal with a single path. This is particularly advantageous in high speed applications.

As the connector housings are mated together, the bus bars 70 are positioned in the bus bar mating terminals 170, as shown in FIG. 7. The spacing between the enlarged contact projections 176 of the bus bar mating terminals 170 is less than the width of the bus bars 70. Consequently, the positioning of the bus bars 70 in the bus bar mating terminals 170 causes the contact projections to be spread apart, which in turn causes contact projections 176 to exert the normal force required on the bus bars 70.

With the connector housing mated together, as shown in FIGS. 4 and 6, an effective electrical connection is provided between the first circuit board 12 and the second circuit board 14. The connection is provided utilizing minimal space, as the first connector housing is mated to the edge or side surface of the first circuit board. This is of great benefit, particularly as board real estate is at a premium.

Figure 19:
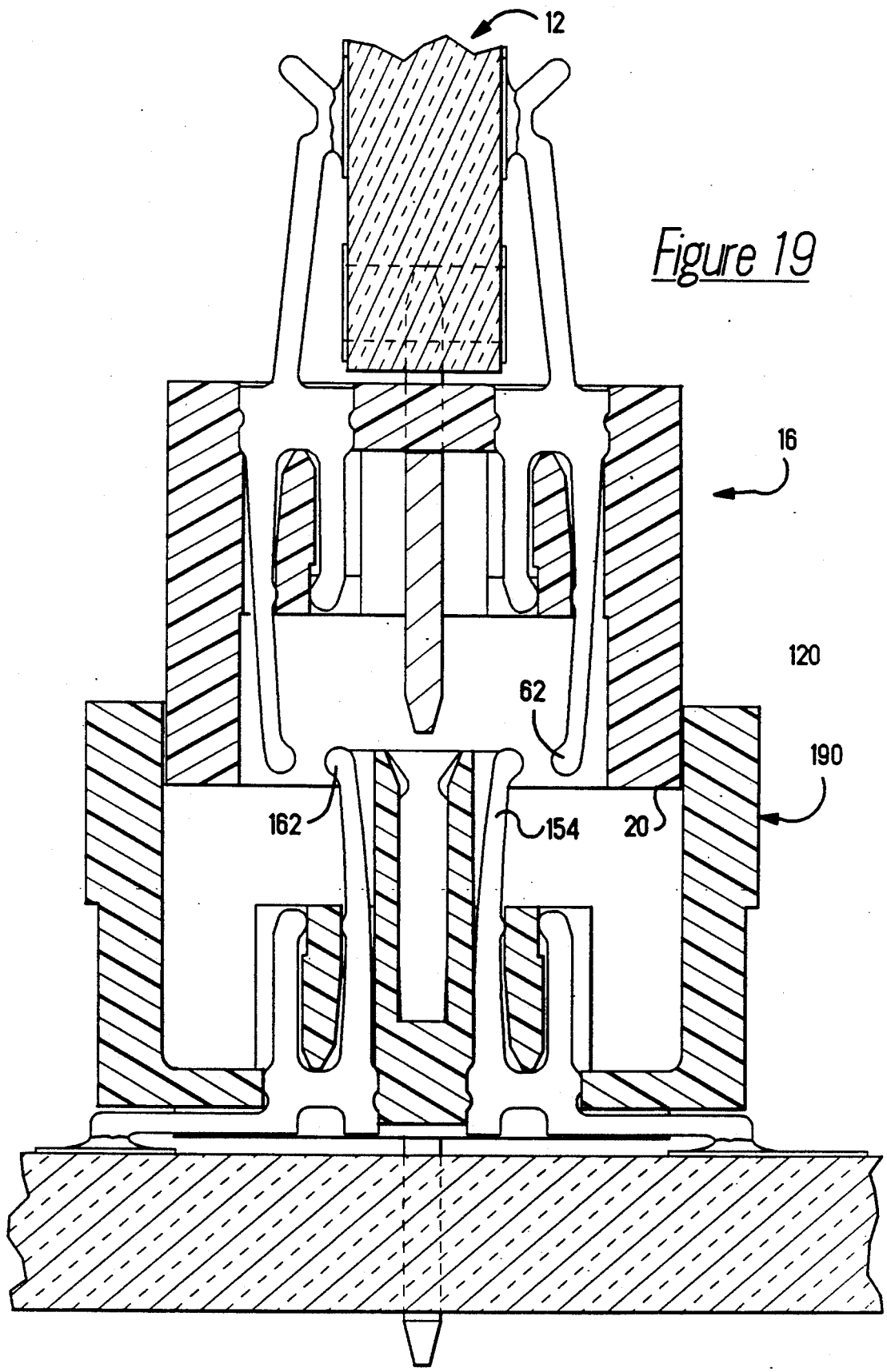
FIG. 19 is a cross-sectional view of an alternative embodiment of a connector housing.

An alternative embodiment of the housing is shown in FIG. 19. In this embodiment the electrical connection provided between the first and the second circuit boards is performed in the same manner described above. However, in the embodiment shown in FIG. 19, the second connector housing 18 has a shroud 190 which extends beyond the mating surface 120. The shroud 190 is dimensioned to be approximately the same height as the mating projection 130. The configuration of the shroud 190 protects the first legs 154 from being deformed prior to mating with the second legs 56 of the first connector housing 16. The shroud 190 also provides for the alignment of the connector housings when the housings are mated together. The shroud insures that the terminals will be in proper position prior to the engagement of the mating terminals, thereby preventing the terminals from being damaged during mating.

Although the connector assembly described provides an electrical connection between two printed circuit boards, the principal of the invention can be utilized in other types of connector assemblies, i.e a cable to board connector assembly.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A connector assembly having a housing with first and second terminals extending therefrom, the first and second terminals have respectively first and second mating legs which cooperate with a printed circuit board provided proximate the housing, the printed circuit board having conductive areas provided on surfaces thereof and conductive openings which extend between the surfaces, the connector assembly comprising:

the first terminals are secured in the housing, first mounting portions of the first terminals are located in first terminal receiving cavities of the housing, the first mating legs are integral with the first mounting portions and extend outside the housing, the first mating legs cooperate with the conductive areas provided on the printed circuit board for surface mounting thereto; and the second terminals are secured in the housing, the second mating legs extend outside the housing, the second mating legs extend through an edge surface of printed circuit board to cooperate with the conductive openings provided on the printed circuit board.

2. A connector assembly as recited in claim 1 wherein the first mating legs are resilient thereby insuring that the first mating legs will make electrical connection with the conductive areas of the substrate.

3. A connector assembly as recited in claim 2 wherein the second mating legs are rigid thereby insuring that the second mating legs will make electrical connection with the openings of the substrate.

4. A connector assembly as recited in claim 3 wherein the first mating legs extend from a mounting surface of the housing in a direction which is essentially perpendicular to the mounting surface.

5. A connector assembly as recited in claim 4 wherein the second mating legs extend from the mounting surface in a direction which is essentially perpendicular to the mounting surface.

6. A connector assembly as recited in claim 3 wherein the conductive openings of the printed circuit board are positioned proximate the edge surface of the printed circuit board.

7. A connector assembly as recited in claim 6 wherein the first mating legs and the second mating legs extend from a mounting surface of the housing in a direction which is essentially perpendicular to the mounting surface.

8. A connector assembly as recited in claim 7 wherein the second mating legs have lead-in surfaces provided at free ends thereof, the lead-in surfaces cooperate with the edge surface of the substrate to allow the second mating legs to be inserted through the edge surface into the openings of the substrate.

9. A connector assembly as recited in claim 8 wherein the printed circuit board has apertures provided in the edge surfaces thereof, the apertures extend in a direction which is essentially perpendicular to the axis of the conductive openings, the apertures are dimensioned to receive the second mating legs of the second terminals therein, such that the second terminals extend through the apertures into the conductive openings.

10. A connector assembly as recited in claim 9 wherein a retention means is provided in the conductive opening, the retention means cooperates with the second mating legs to maintain the second mating legs in the conductive openings.

* * * * *